(12) United States Patent
Yamada et al.

(10) Patent No.: US 7,462,567 B2
(45) Date of Patent: Dec. 9, 2008

(54) METHOD FOR MANUFACTURING INTEGRATED CIRCUIT

(75) Inventors: Tetsuya Yamada, Gifu (JP); Tsutomu Imai, Anpachi-gun (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 92 days.

(21) Appl. No.: 11/790,230

(22) Filed: Apr. 24, 2007

(65) Prior Publication Data

US 2007/0254400 A1    Nov. 1, 2007

(30) Foreign Application Priority Data

Apr. 26, 2006   (JP)   ............................. 2006-122520

(51) Int. Cl.
  *H01L 21/302*   (2006.01)
  *H01L 21/461*   (2006.01)
(52) U.S. Cl. ..................... 438/738; 438/22; 438/42; 438/43
(58) Field of Classification Search .............. 438/22, 438/23, 24, 29, 42, 43, 738
See application file for complete search history.

(56) References Cited

U.S. PATENT DOCUMENTS 6,873,025 B2 *   3/2005   Wada et al. ................ 257/461
2002/0110950 A1 *   8/2002   Matsuda ..................... 438/70
2003/0228084 A1 *  12/2003   Kanda et al. ................ 385/14
2005/0205997 A1 *   9/2005   Yamamoto et al. .......... 257/751
2006/0154034 A1 *   7/2006   Araki ......................... 428/209
2007/0018263 A1 *   1/2007   Noma ......................... 257/428

* cited by examiner

*Primary Examiner*—S. V Clark
(74) *Attorney, Agent, or Firm*—Oliff & Berridge, PLC (57) ABSTRACT

The flatness of the surface of the light-receiving portion must be increased when the upper structural layer of a light detector is etched. The present invention provides a method for manufacturing an integrated circuit in which an aperture is formed in a stack in which an underlayer, a light-receiving area pad, and an upper structural layer are layered on a substrate, the method comprising a light-receiving area pad etching step for etching the structural layer and the light-receiving area pad under etching conditions in which a high selectivity ratio is maintained between the upper structural layer and the light-receiving area pad; and an underlayer etching step for switching to etching conditions in which the light-receiving area pad has a high selectivity ratio in relation to the underlayer following the light-receiving area pad etching step, and etching the light-receiving area pad and the underlayer. The bottom surface of the aperture can thereby be made flatter and the amount of incident light in the plane of the light-receiving portion can be made more uniform.

8 Claims, 7 Drawing Sheets

METHOD FOR MANUFACTURING INTEGRATED CIRCUIT

CROSS-REFERENCE TO RELATED APPLICATION

The priority application number JP2006-122520 upon which this patent application is based is hereby incorporated by the reference.

BACKGROUND OF THE INVENTION

1. Field of the Invention

The present invention relates to a manufacturing method that is used to form an integrated circuit on a semiconductor substrate or the like, and particularly relates to a method for etching an upper structural layer that has been layered on a substrate.

2. Description of the Related Art

Optical disks such as CDs (Compact Disk) and DVDs (Digital Versatile Disk) have recently come to occupy a large position as information recording media. Playback devices for these optical disks irradiate laser light along a track of the optical disk and detect the reflected light by using an optical pick-up mechanism. Recorded data is played back based on changes in the intensity of the reflected light.

Since the data rate for reading from optical disks is extremely high, the light detector for detecting the reflected light is composed of a semiconductor device that uses a PIN photodiode having a high response rate. The weak photoelectric conversion signal generated by the light-receiving portion of the semiconductor device is amplified by an amplifier and then output to a subsequent signal-processing circuit. The length of wiring between the light-receiving portion and amplifier is therefore reduced as much as possible in order to maintain the frequency characteristics of the photoelectric conversion signal and to minimize the superposition of noise. The light-receiving portion and the circuit portion, including the amplifier and the like, are preferably formed on the same semiconductor chip because of these issues and also from the standpoint of reducing the cost of manufacturing the light detector.

Figure 1:
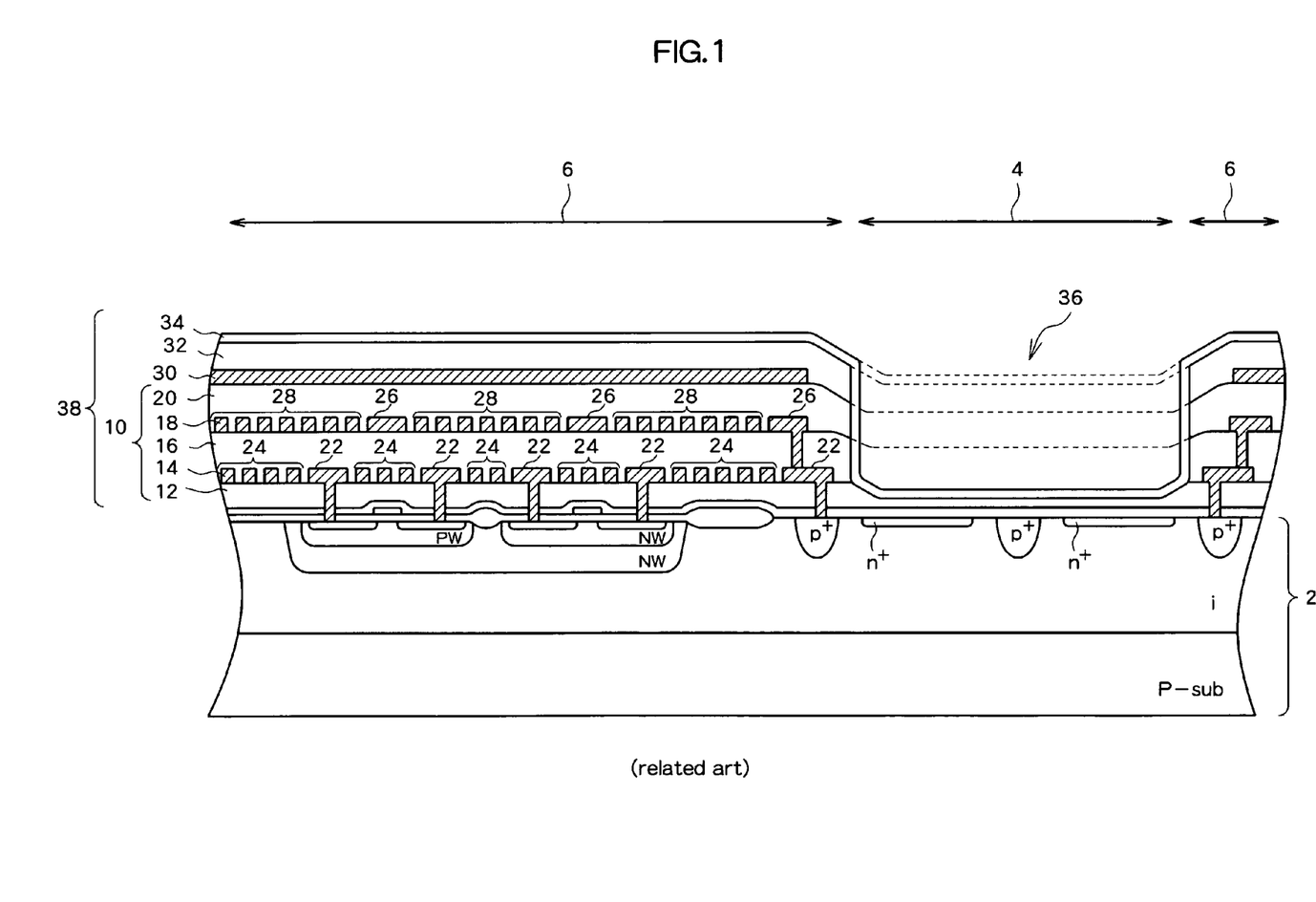
FIG. 1 is a schematic cross-sectional diagram showing the circuit portion and the light-receiving portion of a conventional light detector.

FIG. 1 is a schematic cross-sectional diagram of a light detector in which the light-receiving portion and the circuit portion are adjacently disposed on the same semiconductor substrate. A PIN photodiode structure is formed on a semiconductor substrate 2 in an area corresponding to the light-receiving portion 4, and transistors and other circuit elements are formed in areas corresponding to the circuit portion 6.

The light detector in FIG. 1 is a bilayer wiring structure, and a wiring structure layer 10 is formed by sequentially layering a first interlayer insulation film 12, a first aluminum (Al) layer 14, a second interlayer insulation film 16, a second Al layer 18, and a third interlayer insulation film 20. The first Al layer 14 and second Al layer 18 are both patterned using photolithography techniques. For example, wiring 22 and planarizing pads 24 are formed in the circuit portion 6 by using the first Al layer 14; and wiring 26 and planarizing pads 28 are formed in the circuit portion 6 by using the second Al layer 18. An Al layer 30 for blocking light is layered on the wiring structure layer 10 of the circuit portion 6, and a silicon oxide film 32 and silicon nitride film 34 are furthermore sequentially formed as protective films. The interlayer insulation films are formed using SOG (Spin on Glass), BPSG (Borophosphosilicate Glass), TEOS (Tetra-ethoxy-silane), or other such material.

An upper structural layer 38 that includes the wiring structure layer 10 is layered on the semiconductor substrate 2 of the light-receiving portion 4. The upper structural layer 38 of the light-receiving portion 4 is preferably removed in order to increase the efficiency of light incidence on the semiconductor substrate 2 of the light-receiving portion 4. In view of this situation, the upper structural layer 38 is selectively etched back in the light-receiving portion 4 and is left unetched in the peripheral circuit portion 6 to form an aperture 36 in the upper structural layer 38 in the light-receiving portion 4.

The Al layers in the light-receiving portion 4 are removed by patterning in advance when the upper structural layer 38 is layered, and the interlayer insulation films 12, 16, 20, and other layers are layered on the light-receiving portion 4. Specifically, the upper structural layer 38 of the light-receiving portion 4 can be made to be lower than the peripheral circuit portion 6 to the extent that the Al layers are removed. In this manner, the bottom surface of the aperture does not become flat, as shown in FIG. 1, because the surface of the upper structural layer 38 is not flat and because of other factors, and nonuniformities in the amount of incident light may occur in the plane of the light-receiving portion 4.

A structure is adopted in which a light-receiving area pad composed of a polysilicon film is formed in correspondence with the position of the light-receiving portion 4 under the upper structural layer 38 in order to avoid the situation described above. The aperture is etched back from the surface of the upper structural layer 38 formed on the light-receiving area pad. The light-receiving area pad has a certain degree of effect to make the depth of the etching uniform within the plane of the aperture.

Figure 2A:
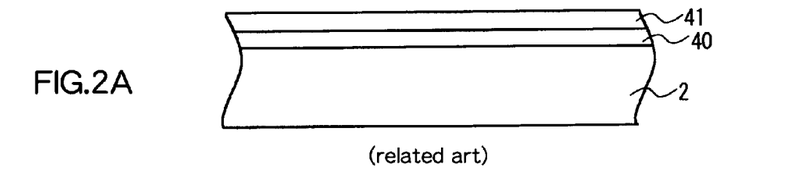
FIGS. 2A to 2E are schematic diagrams showing cross-sectional structures in the principal steps for forming an aperture in a conventional light detector.

FIGS. 2A to 2E and FIGS. 3A to 3C are schematic diagrams that describe methods for manufacturing a conventional light detector in which a polysilicon film is first formed and an aperture is then formed in locations that correspond to the position of the light-receiving portion 4. The drawings are schematic cross-sectional diagrams of the vicinity of the light-receiving portion 4 in the principal steps of the method. A silicon oxide film 40 is formed on the semiconductor substrate 2 on which PIN photodiodes, transistors, and other components have been formed, and a polysilicon film 41 is deposited on the surface of the silicon oxide film (FIG. 2A).

Figure 2B:
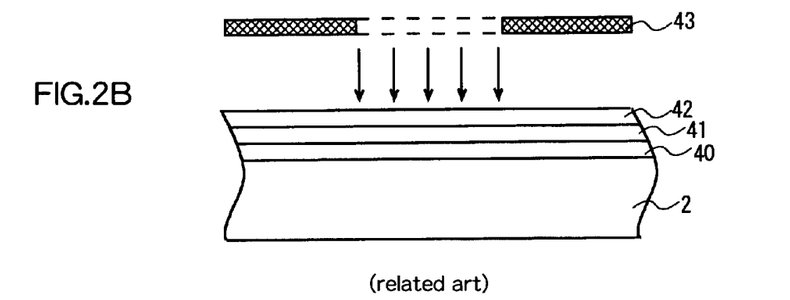
Figure 2C:
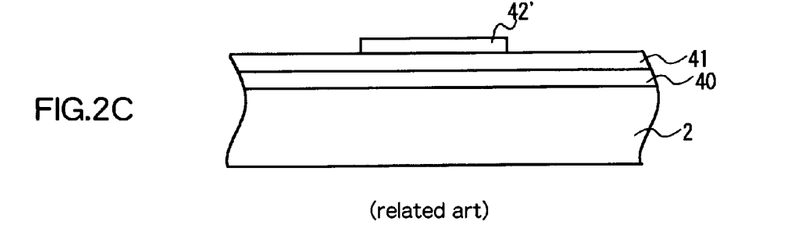

A photoresist is coated onto the polysilicon film 41 to form a photoresist film 42. The photoresist film 42 is exposed using a photomask 43 that is configured to be capable of transmitting light in the area that corresponds to the light-receiving portion (FIG. 2B). A photoresist film 42' that remains in a position corresponding to the light-receiving portion is thereafter formed by a development process (FIG. 2C).

Figure 2D:
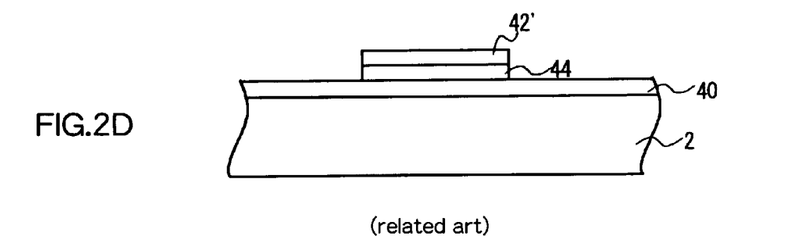

The polysilicon film 41 is etched away using the photoresist film 42' as an etching mask, and a light-receiving area pad 44 composed of polysilicon film is formed in an area that corresponds to the light-receiving portion (FIG. 2D).

Figure 2E:
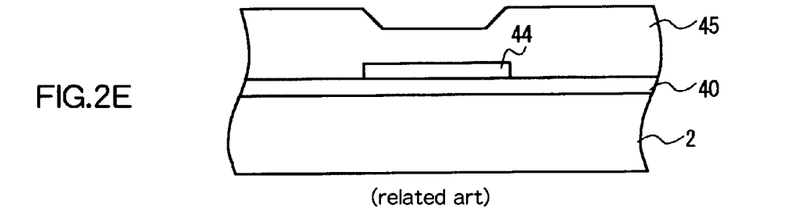

The photoresist film 42' on the light-receiving area pad 44 is removed and an upper structural layer 45 is thereafter layered on the light-receiving area pad 44 and silicon oxide film 40 (FIG. 2E).

Figure 3A:
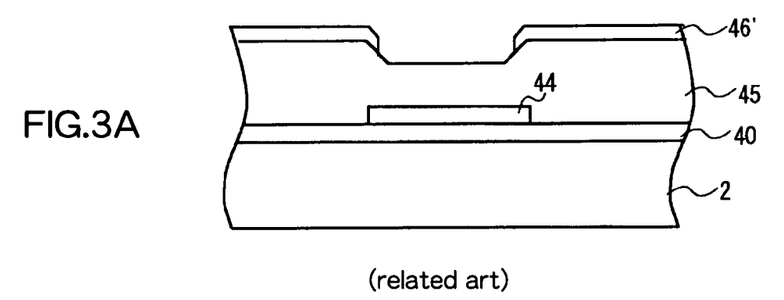
FIGS. 3A to 3C are schematic diagrams showing cross-sectional structures in the principal steps for forming an aperture in a conventional light detector.
Figure 3B:
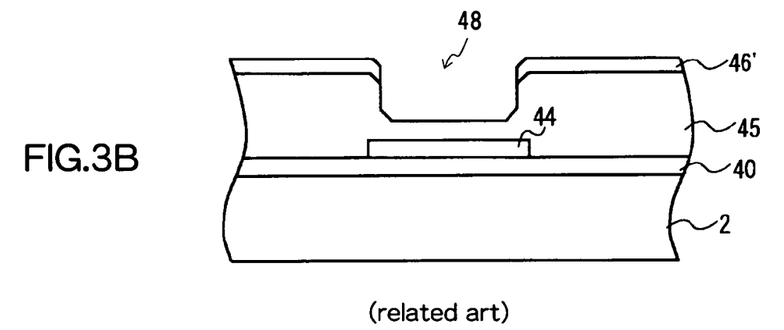

A photoresist is subsequently coated onto the upper structural layer 45 to form a photoresist film 46. The photoresist film 46 is exposed using a photomask that blocks light from the area corresponding to the light-receiving portion. A photoresist film 46' in which an aperture has been formed in a position that corresponds to the light-receiving portion is thereafter formed by a development process (FIG. 3A).

Next, the upper structural layer 45 is etched with the aid of a magnetron reactive ion etching (magnetron RIE) device by using the photoresist film 46' as an etching mask. In this situation (FIG. 3B), an etching gas that contains $CF_4$ is used on the upper structural layer 45. This step etches the upper structural layer 45 and the light-receiving area pad 44, and the aperture 48 is etched down to the upper surface of the silicon oxide film 40 (FIG. 3C).

A stepped portion is formed in the upper structural layer 45 between the light-receiving portion area and the circuit portion at the periphery of the light-receiving portion area so that metal wiring will not be formed on the light-receiving portion area of the upper structural layer 45 that forms the aperture 48 described above. As a result, the thickness of the upper structural layer 45 at the edge of the aperture of the photoresist film 46' is greater than the thickness of the layer 45 in the center of the aperture of the photoresist film 46' as shown in FIG. 3A.

Figure 3C:
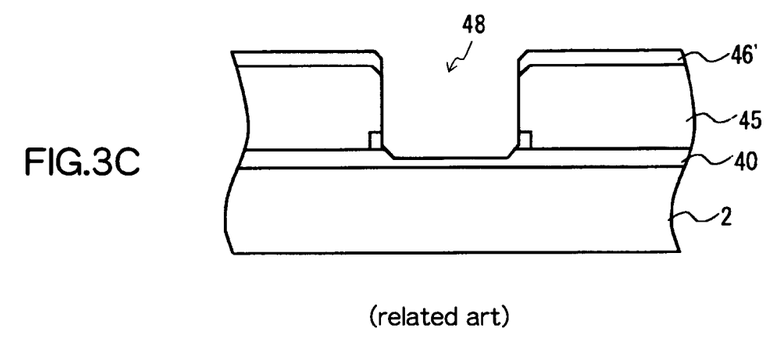

For this reason, when the aperture 48 is formed by etching under the conditions described above, the thickness of the edges of the light-receiving portion after etching is greater than that at the center, as shown in FIG. 3C, and the photosensitivity is not uniform in the plane of the light-receiving portion.

SUMMARY OF THE INVENTION

The present invention provides a method for manufacturing an integrated circuit that can form a light-receiving portion having greater flatness.

The present invention provides a method for manufacturing an integrated circuit having an aperture in a stack in which an underlayer, a light-receiving area pad, and an upper structural layer are sequentially layered on a substrate, the method comprising a light-receiving area pad etching step for etching the structural layer and the light-receiving area pad under etching conditions in which the upper structural layer has a high selectivity ratio in relation to the light-receiving area pad; and an underlayer etching step for switching to etching conditions in which the light-receiving area pad has a high selectivity ratio in relation to the underlayer following the light-receiving area pad etching step, and etching the light-receiving area pad and the underlayer.

DESCRIPTION OF THE PREFERRED EMBODIMENTS

Embodiments of the present invention (hereinafter referred to as "embodiments") are described below with reference to the diagrams.

The present embodiment is a light detector mounted on an optical pick-up mechanism of an optical disk playback device such as a CD and a DVD.

Figure 4:
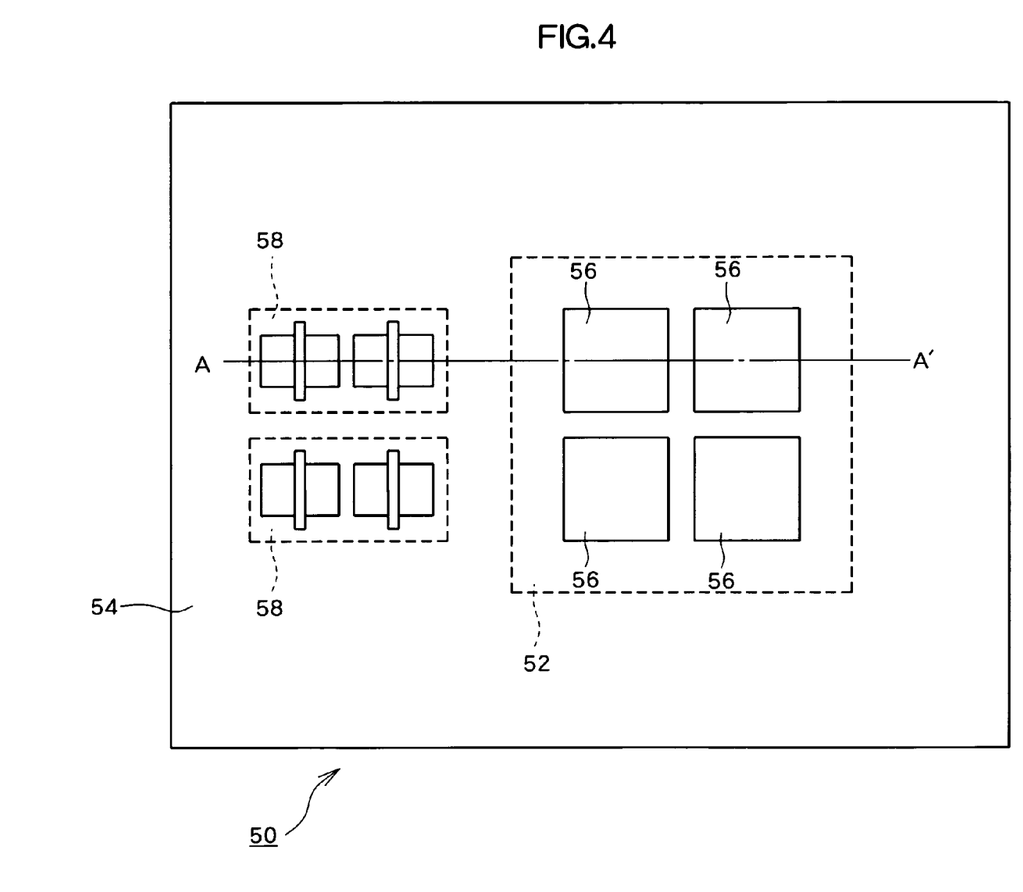
FIG. 4 is a general plan view of a semiconductor device, which is the light detector according to the present embodiment.

FIG. 4 is a general plan view of a semiconductor device, which is the light detector according to the present embodiment. This light detector 50 is formed on a semiconductor substrate composed of silicon. The light detector 50 is composed of a light-receiving portion 52 and a circuit portion 54. The light-receiving portion 52 includes, e.g., four PIN photodiodes (PD) 56 arrayed in a 2×2 matrix; and light incident on the surface of the substrate from an optical system is divided into four segments and received. The circuit portion 54 is disposed, e.g., on the periphery of the light-receiving portion 52. The circuit portion 54 has, e.g., CMOS 58 and other circuit elements formed thereon. An amplifier circuit and other signal processing circuits for processing signals outputted from the light-receiving portion 52 can be formed on the same semiconductor chip as the light-receiving portion 52 by using the circuit elements in the circuit portion 54. Although not depicted in FIG. 4, wiring connected to the circuit elements, and wiring connected to a diffusion layer constituting the light-receiving portion 52 are disposed on the circuit portion 54. These wirings are formed by patterning an Al film layered on the semiconductor substrate.

Figure 5:
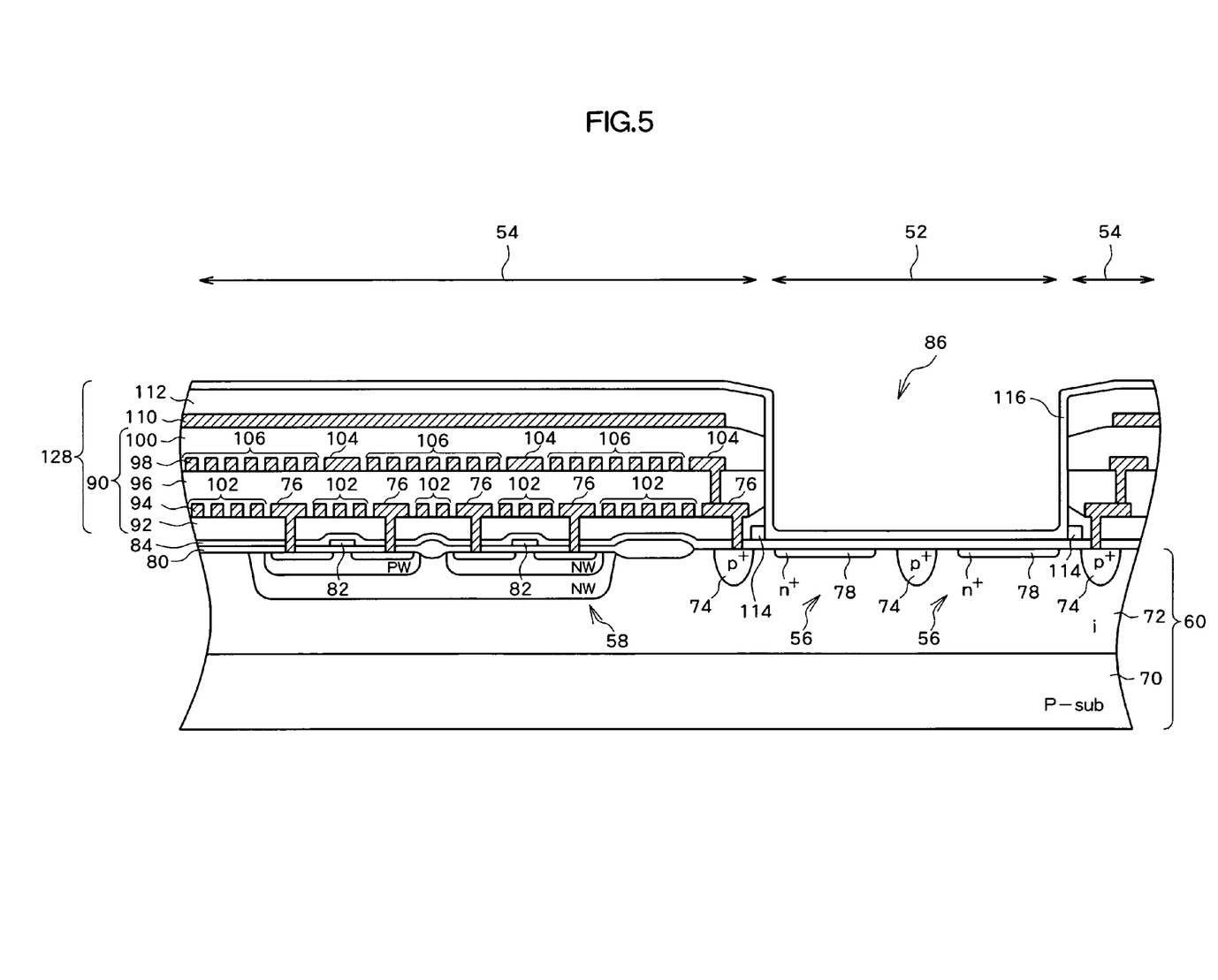
FIG. 5 is a schematic cross-sectional diagram showing the circuit portion and the light-receiving portion of the light detector of the present embodiment.

FIG. 5 is a schematic cross-sectional diagram showing the structure of the circuit portion 54 and the light-receiving portion 52 in a vertical cross section of the semiconductor substrate along the line A-A' shown in FIG. 4. The cross section shows the two PDs 56 of the light-receiving portion 52; the CMOS 58 of the circuit portion 54; and the wiring, interlayer insulation films, and other structures layered on a semiconductor substrate 60 on which the PDs and the CMOS are formed.

The photodetector 50 is fabricated using the semiconductor substrate 60 in which an epitaxial layer 72, having a lower impurity concentration and a high specific resistance than a P-sub layer 70, is grown on the P-sub layer 70, which is a p-type silicon substrate in which p-type impurities have been introduced. The P-sub layer 70 constitutes an anode that is shared by the PDs 56, and a ground potential is applied from the reverse side of the substrate, for example. Separation areas 74 are configured so that a ground potential is applied via wiring 76 disposed on the substrate surface side, and the areas constitute an anode together with the P-sub layer 70.

In the light-receiving portion 52, the epitaxial layer 72 constitutes the i-layer of the PD 56. In the light-receiving portion 52, the separation areas 74 and cathode areas 78 are formed on the surface of the epitaxial layer 72.

A silicon oxide film 80 composed of a gate oxide film and a local oxide film (LOCOS) is formed on the surface of the semiconductor substrate 60. A gate electrode 82 composed of the MOSFET that constitutes the CMOS 58 or the like is formed using, e.g., polysilicon, tungsten (W), or the like on the gate oxide film. A silicon oxide film 84 is formed on the surface of the substrate so as to cover the silicon oxide film 80 and the gate electrode 82.

After the silicon oxide film 84 is formed, a light-receiving area pad composed of a polysilicon film is formed in a position corresponding to the light-receiving portion 52. The light-receiving area pad is used as an etching stopper when the wiring structure layer 90 is etched back and the aperture 86 is formed in the position of the light-receiving portion 52, as described below. For this reason, the light-receiving area pad is extended and formed outward from the opening of the aperture 86.

After the light-receiving area pad is formed, an upper structural layer 128 composed of a wiring structure, a protective film, or the like is formed on the semiconductor substrate 60. The wiring of the light detector 50 is a bilayer structure; and a first interlayer insulation film 92, a first Al layer 94, a second interlayer insulation film 96, a second Al layer 98, and a third interlayer insulation film 100 are formed on the semiconductor substrate 60 as a wiring structure layer 90. The first Al layer 94 and the second Al layer 98 are each patterned using photolithography techniques. For example, wiring 76 and planarizing pads 102 are formed in the circuit portion 54 by using the first Al layer 94, and wiring 104 and planarizing pads 106 are formed in the circuit portion 54 by using the second Al layer 98.

In this case, the planarizing pads 102 and 106 are disposed in the gaps between the wiring 76 and 104, respectively, and the pads reduce the irregularities on the surface of the interlayer insulation films 96 and 100 layered on the first Al layer 94 and the second Al layer 98, respectively. The interlayer insulation film is formed using materials such as SOG, BPSG, and TEOS.

An Al layer 110 for blocking light is layered on the wiring structure layer 90 of the circuit portion 54, and a silicon oxide film 112 is furthermore formed as a protective layer.

Specifically, the wiring structure layer 90 and the overlying layer, i.e., the upper structural layer 128, are etched back in order to increase the efficiency of light incidence on the PD 56 of the light-receiving portion 52, and an aperture 86 is formed in the area corresponding to the light-receiving portion 52. The wiring structure layer 90 is thus etched in the light-receiving portion 52 to form an aperture 86, whereby transmission of light to the PD 56 is improved and the necessary amplitude of the photoelectric conversion signals produced by reflected laser light is assured.

The light-receiving area pad disposed under the wiring structure layer 90 is etched in the process to form the aperture 86, and the portion of the light-receiving area pad present on the bottom surface of the aperture 86 is removed. For this reason, the light-receiving area pad in the bottom portion of the aperture 86 is already absent, and only the extended portion 114 of the light-receiving area pad that extends outward from the aperture 86 remains in FIG. 5.

After the aperture 86 is formed, a silicon nitride film 116 is deposited. The silicon nitride film 116 covers the upper surface of the silicon oxide film 112 and the side wall surface and the bottom surface the aperture 86. The silicon nitride film 116 formed on the upper surface constitutes a protective layer together with the silicon oxide film 112. The silicon nitride film 116 formed on the side wall surface of the aperture 86 covers the interlayer insulation films exposed on the side wall surface and inhibits the penetration of moisture into the wiring structure layer 90, thereby preventing the degradation of the wirings 76 and 104. The silicon nitride film 116 formed on the bottom surface of the aperture 86 functions as an antireflective film for reducing the reflection of light incident on the PD 56 from the bottom surface of the aperture 86.

The method for manufacturing the light detector 50 is described next with reference to FIGS. 6A to 6G. FIGS. 6A to 6G are schematic diagrams describing the method for manufacturing the light detector. In this method, the aperture 86 is formed after the light-receiving area pad is formed in a location corresponding to the position of the light-receiving portion 52. The drawings are schematic cross-sectional diagrams of the vicinity of the light-receiving portion 52 in the principal steps.

Figure 6A:
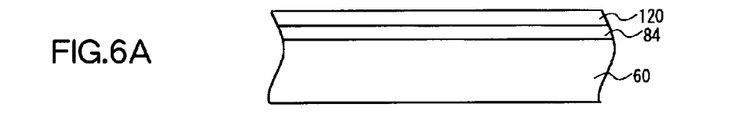
FIGS. 6A to 6G are schematic diagrams showing cross-sectional structures in the principal steps for forming an aperture in the light detector of the present embodiment.

The silicon oxide film 84 is formed as an underlayer on the semiconductor substrate 60 on which the PD 56, CMOS 58, and other components described above have been formed. The silicon oxide film 84 is deposited by CVD, for example. A polysilicon film 120 is furthermore formed by CVD or another method on the silicon oxide film 84 (FIG. 6A).

Figure 6B:
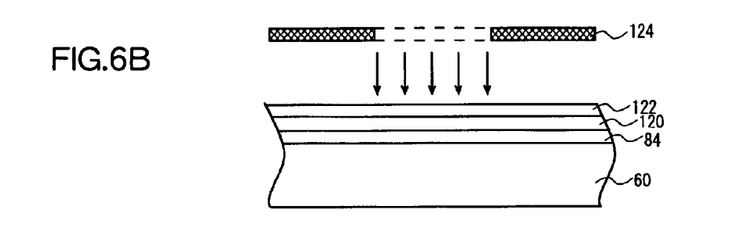

A photoresist is coated on the polysilicon film 120 to form a photoresist film 122. The photoresist film 122 is exposed by using a photomask 124 configured to transmit light through the area corresponding to the light-receiving portion 52 (FIG. 6B).

Figure 6C:
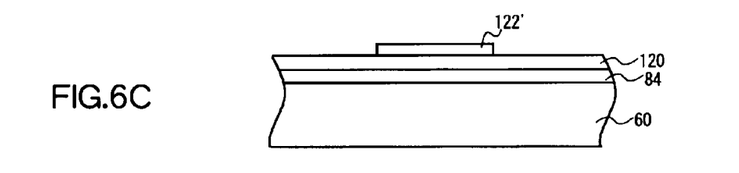

A development process is carried out thereafter, and the unexposed areas of the photoresist film 122 are removed, whereby the photoresist film 122' remaining in a position corresponding to the light-receiving portion 52 is formed (FIG. 6C).

Figure 6D:
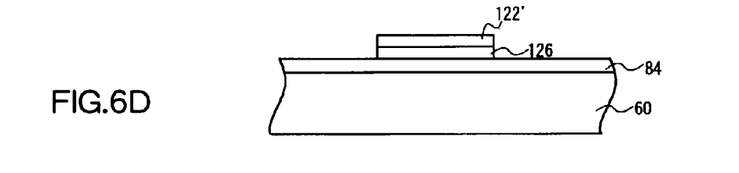

The polysilicon film 120 is etched using the thus-formed photoresist film 122' as an etching mask, and the polysilicon film 120 is selectively left behind in the area corresponding to the light-receiving portion 52 to form a light-receiving area pad 126 (FIG. 6D).

Figure 6E:
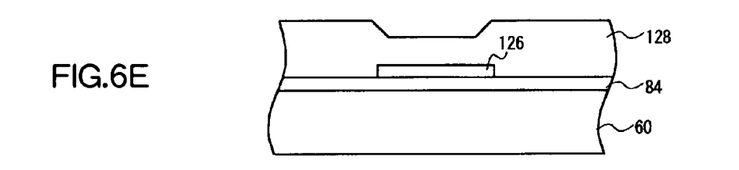

The photoresist 122' on the light-receiving area pad 126 is removed, and an upper structural layer 128 composed of, e.g., a $SiO_2$ layer is then layered (FIG. 6E). The constituent layers of the upper structural layer 128 can be layered using CVD or PVD.

The Al layers, which are some of the layers that have been layered as the upper structural layer 128, are patterned and removed from above the light-receiving portion 52. Therefore, in the upper structural layer 128, the light-receiving portion 52 is thinner than the surrounding circuit portion in the midway stage in which the interlayer insulation films 96 and 100 are layered and in the stage in which all of the layers have been layered.

Figure 6F:
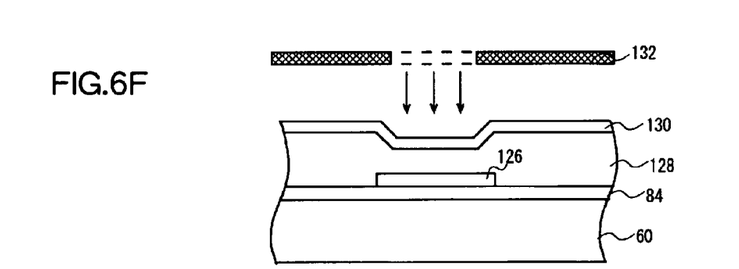

Next, a photoresist is coated onto the upper structural layer 128 to form a photoresist film 130. The photoresist film 130 is exposed using a photomask 132 (FIG. 6F).

Figure 6G:
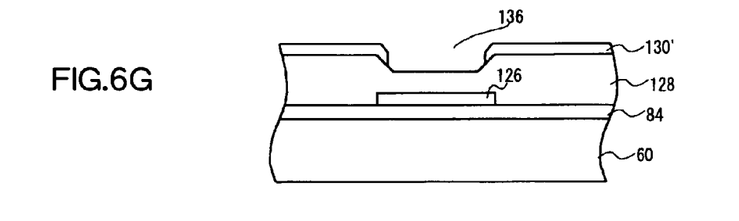

The development process is performed thereafter. The photomask 132 is configured to transmit light in the area corresponding to the light-receiving portion 52. The photoresist film 130 is therefore exposed in the area corresponding to the light-receiving portion 52, and the area is removed in the development process. A photoresist 130' having an aperture 136 in a position corresponding to the light-receiving portion 52 is thereby formed (FIG. 6G).

The upper structural layer 128 is subsequently etched using the photoresist film 130' as an etching mask. In the present embodiment, three-stage etching is carried out using the magnetron RIE device shown in FIG. 7 as the etching device in order to form the aperture in the upper structural layer 128.

Figure 7:
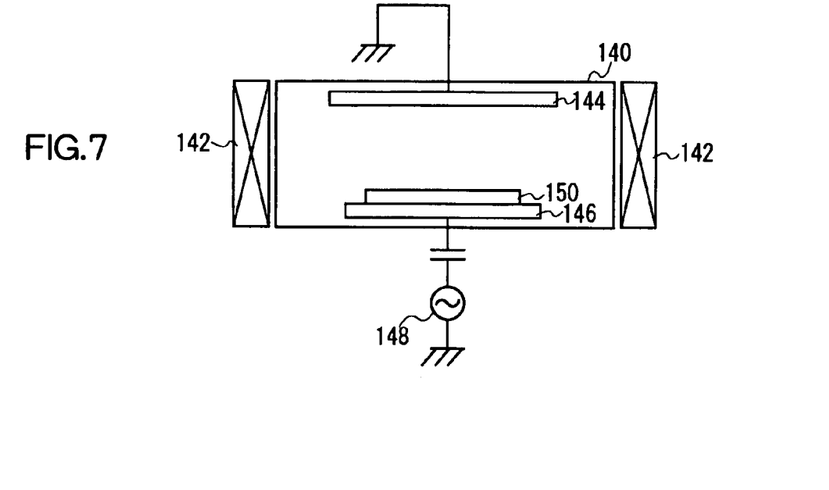
FIG. 7 is a schematic view of the etching apparatus device according to the present embodiment.

The magnetron RIE device is described below with reference to the schematic diagram shown in FIG. 7.

The walls of a reaction chamber 140 for carrying out plasma treatment are electroconductive and are fixed at the ground potential. The reaction chamber 140 has a gas inlet for introducing etching gas, and an exhaust port for exhausting the etching gas and a residue decomposed by etching (not shown). A lower electrode 146 is connected to a high-frequency power source 148 having a frequency of 13.56 MHz as a biased power source. A substrate 150 that has undergone the steps that precede etching is placed on the lower electrode 146. An upper electrode 144 is grounded. A permanent magnet (dipole ring magnet) 142 is disposed in the side walls outside the reaction chamber and is caused to generate a magnetic field inside the reaction chamber.

Generating a magnetic field in the reaction chamber in this manner allows the gas pressure to be lowered, the ion energy to be reduced while increasing plasma density, and the combination of the magnetic field and the electric field to increase the plasma density in the vicinity of the surface of the electrodes.

Figure 8A:
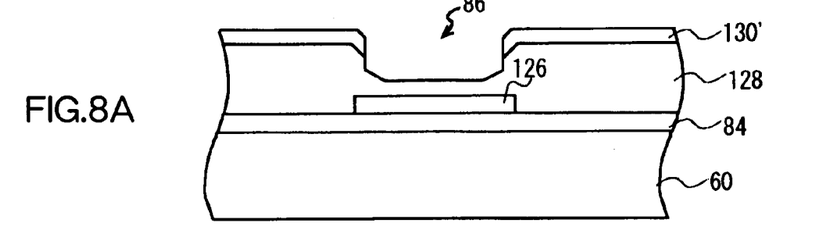
FIGS. 8A to 8C are schematic diagrams showing cross-sectional structures in the principal steps for forming an aperture in the light detector.
Figure 8B:
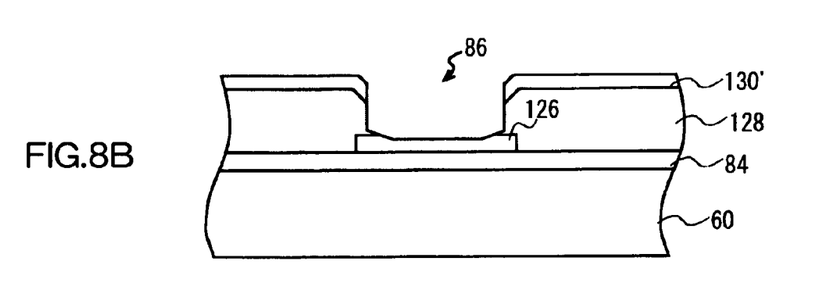
Figure 8C:
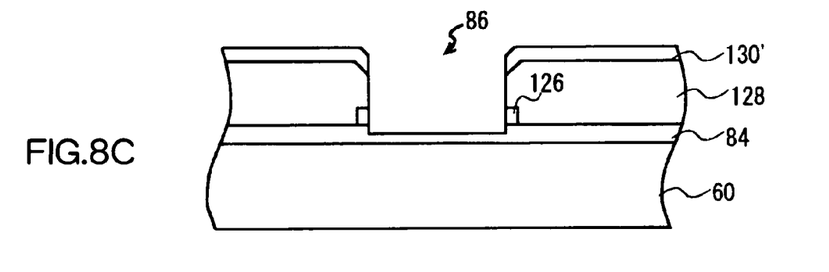

The method for etching the light detector 50 in which a magnetron RIE device is used is described next with reference to FIGS. 8A to 8C. Similar to FIGS. 6A to 6G, FIGS. 8A to 8C are schematic diagrams describing the method for manufacturing the light detector. In the method, the aperture 86 is formed after the light-receiving area pad has been formed in a location corresponding to the position of the light-receiving portion 52. The drawings are schematic cross-sectional diagrams of the vicinity of the light-receiving portion 52 in the principal steps.

First, in the upper structural layer etching step, the upper structural layer 128 is etched using as a mask the photoresist film 130' having an aperture 136 in a position corresponding to the light-receiving portion 52 (FIG. 8A). The etching in this case preferably does not reach the light-receiving area pad 126.

In the upper structural layer etching step, the light-receiving area pad 126 preferably functions as an etching stopper when the aperture 86 is etched back. Therefore, the method is preferably one in which the etching of the aperture 86 is not likely to extend beyond the opening 132. From this standpoint, the upper structural layer etching step is preferably carried out using an anisotropic etching process.

The thickness of the upper structural layer 128 in the upper portion of the light-receiving area pad 126 is 1.5 to 2 μm, which is considerable in comparison with the thickness of the light-receiving area pad, which has a thickness of 0.1 to 0.2 μm. Therefore, conditions are preferably selected in which the silicon oxide film constituting the upper structural layer 128 is rapidly etched in order to accelerate the manufacturing process.

Considering these facts, the etching gas is preferably selected from gases that contain $CF_4$. Mixed gases containing $CHF_3$ and $CF_4$, for example, are preferably used.

Next, the light-receiving area pad etching step is carried out by etching the upper structural layer 128 and the light-receiving area pad 126 using the photoresist 130' as a mask (FIG. 8B). In this case, etching is carried out so that the silicon oxide film 84 is not reached.

The light-receiving area pad etching step is preferably carried out using a method in which the etching of the aperture 86 does not extend beyond the opening 136 because the light-receiving area pad 126 is made to efficiently function as an etching stopper for the etchback of the aperture 86 in the same manner as in the upper structural layer etching step. From this standpoint, the light-receiving area pad etching step is preferably carried out using an anisotropic etching process.

Since metal wiring is not formed in the upper structural layer 128 on the light-receiving portion, a difference in level is formed in the upper structural layer 128 between the light-receiving portion area and the circuit portion on the periphery of the light-receiving portion area, as shown in FIG. 6G. This difference in level is reflected in the depth of the aperture 86 after the upper structural layer has been etched, and the thickness of the remaining film of the upper structural layer 128 at the edge is greater than the thickness of the film in the center upon completion of the upper structural layer etching step.

When a film having thickness variations is etched in this fashion, an etched shape is produced in which the edge portion is thicker than the center portion.

In view of this situation, in the light-receiving area pad etching step, etching conditions are selected in which the selectivity between the upper structural layer 128 and the light-receiving area pad 126 is greater than that used in the upper structural layer etching step (the etching rate of the upper structural layer 128 is greater than that of the light-receiving area pad 126) in order to reduce the difference in film thickness.

The etching rate of the silicon oxide film is made greater than that of polysilicon by switching the etching gas, for example. Hence, the difference in the thickness of the film at the center and at the edge can be reduced because the upper structural layer 128 composed of silicon oxide film that is left at the edges is etched more rapidly than polysilicon when the center of the light-receiving area pad 126 composed of polysilicon is etched, as shown in FIG. 8B.

Considering these points, a gas used in the light-receiving area pad etching step is preferably selected from gases that contain $CO_2$. Mixed gases containing $CO_2$ and $CHF_3$, for example, are preferably used.

The underlayer etching step is carried out using the photoresist film 130' as a mask to etch the light-receiving area pad 126 and the silicon oxide film 84 so that the semiconductor substrate is not reached (FIG. 8C).

In the underlayer etching step, etching conditions are selected in which the selectivity of the light-receiving area pad 126 is greater than that of the silicon oxide film 84 (the etching rate of the light-receiving area pad 126 is greater than that of the silicon oxide film 84, which is the underlayer) in order to reduce the difference in film thickness in the same manner as in the light-receiving area pad etching step.

The difference in the thickness of the film in the center and the edges can be further reduced by switching the etching conditions in this manner because the polysilicon at the edges is etched more rapidly when the silicon oxide film 84 of the center area of the aperture 86 is etched, as shown in FIG. 8C.

Considering these facts, etching is preferably carried out using a gas containing $SF_6$ as the gas used in the underlayer etching step, and mixed gases containing $SF_6$ and $NF_3$, for example, are preferably used.

The underlayer etching step is preferably carried out using an isotropic etching process. An isotropic etching process reduces physical damage to the bottom surface of the aperture and further improves flatness. A chemical dry etching device or the like can be used for isotropic etching.

The photoresist 130' is removed when the aperture 86 has been completely etched. Silicon nitride is deposited using CVD, for example, and the silicon nitride film 116 is formed on the top surface of the upper structural layer 128 and on the side wall surface and the bottom surface of the aperture 86. A basic structure of the light detector 50 shown in FIG. 5 is formed thereby.

The bottom surface of the aperture can be made flatter and the amount of incident light in the plane of the light-receiving portion can be made more uniform by carrying out the etching steps in three stages as described above.

In the present embodiment, polysilicon was selected as the material of the light-receiving area pad, but no limit is imposed thereby, and Al, a high-melting metal, or another metal may be used, or a silicon nitride film or another insulation film may be used.

When such a light-receiving area pad formed using a material other than polysilicon is employed, the upper structural layer etching step is performed under etching conditions in which the etching rate of the upper structural layer is high, the light-receiving area pad etching step is performed under etching conditions in which the selectivity of the upper structural layer relative to the light-receiving area pad is higher than in the upper structural layer etching step, and the underlayer etching step is performed under etching conditions in which the selectivity of the light-receiving area pad relative to the underlayer is high. The bottom surface of the aperture can thereby be made flatter, and the amount of incident light in the plane of the light-receiving portion can be made more uniform.

In the present embodiment, the light-receiving area pad etching step and the upper structural layer etching step were performed in different etching conditions, but the etching conditions may be the same.

In the present embodiment, the etching method was described as using a magnetron RIE device, but no limitation is imposed thereby, and an inductively coupled plasma (ICP) device or the like, or another method may be used.

As described above, the present invention provides a method for manufacturing an integrated circuit having an aperture in a stack in which an underlayer, a light-receiving area pad, and an upper structural layer are sequentially layered on a substrate, the method comprising a light-receiving area pad etching step for etching the structural layer and the light-receiving area pad under etching conditions in which the upper structural layer has a high selectivity ratio in relation to the light-receiving area pad; and an underlayer etching step for switching to etching conditions in which the light-receiving area pad has a high selectivity ratio in relation to the underlayer following the light-receiving area pad etching step, and etching the light-receiving area pad and the underlayer.

In the embodiment described above, the method for manufacturing an integrated circuit according to the present invention was described as comprising an upper structural layer etching step for etching the upper structural layer under conditions in which the etching rate of the upper structural layer is greater than that in the etching conditions of the light-receiving area pad etching step prior to the light-receiving area pad etching step.

For example, the light-receiving area pad etching step may be carried out using an anisotropic etching method, and the underlayer etching step may be carried out using an isotropic etching method.

The upper structural layer etching step and the light-receiving area pad etching step maybe carried out using an anisotropic etching method, and the underlayer etching step may be carried out using an isotropic etching method.

The method for manufacturing an integrated circuit according to the present invention can be advantageously applied to an integrated circuit in which the underlayer is composed of a silicon oxide film.

The method for manufacturing an integrated circuit according to the present invention can be advantageously applied to an integrated circuit in which the light-receiving area pad is polysilicon.

The method for manufacturing an integrated circuit according to the present invention can be advantageously applied to an integrated circuit in which the upper structural layer contains a silicon oxide film.

The method for manufacturing an integrated circuit according to the present invention can be advantageously applied to an integrated circuit in which a light-receiving portion is formed on the substrate under the area in which the upper structural layer has been opened by etching.

In accordance with the present invention, the bottom surface of the aperture can be made flatter and the amount of incident light in the plane of the light-receiving portion can be made more uniform.

The invention claimed is:

1. A method for manufacturing an integrated circuit having an aperture in a stack in which an underlayer, a light-receiving area pad, and an upper structural layer are sequentially layered on a substrate, the method comprising:
   a light-receiving area pad etching step for etching the structural layer and the light-receiving area pad under etching conditions in which the upper structural layer has an etch rate which is greater than that of the light-receiving area pad; and
   an underlayer etching step for switching to etching conditions in which the light-receiving area pad has an etch rate which is greater than that of the underlayer following the light-receiving area pad etching step, and etching the light-receiving area pad and the underlayer.

2. The method for manufacturing an integrated circuit of claim 1, comprising an upper structural layer etching step for etching the upper structural layer under conditions in which the etching rate of the upper structural layer is greater than that of the etching conditions of the light-receiving area pad etching step prior to the light-receiving area pad etching step.

3. The method for manufacturing an integrated circuit of claim 1, wherein
   the light-receiving area pad etching step is an anisotropic etching method; and
   the underlayer etching step is an isotropic etching method.

4. The method for manufacturing an integrated circuit of claim 2, wherein
   the upper structural layer etching step and the light-receiving area pad etching step are anisotropic etching methods; and
   the underlayer etching step is an isotropic etching method.

5. The method for manufacturing an integrated circuit of claim 1, wherein the underlayer is composed of a silicon oxide film.

6. The method for manufacturing an integrated circuit of claim 1, wherein the light-receiving area pad is polysilicon.

7. The method for manufacturing an integrated circuit of claim 1, wherein the upper structural layer contains a silicon oxide film.

8. The method for manufacturing an integrated circuit of claim 1, wherein a light-receiving portion is formed on the substrate under the area in which the upper structural layer has been opened by etching.

* * * * *